US008872555B2

(12) United States Patent
Chen et al.

(10) Patent No.: US 8,872,555 B2
(45) Date of Patent: Oct. 28, 2014

(54) POWER-ON RESET CIRCUIT

(71) Applicant: Princeton Technology Corporation, New Taipei (TW)

(72) Inventors: Ko-Han Chen, New Taipei (TW); Ming-Yuan Tsao, New Taipei (TW); Dang-Ching Lin, New Taipei (TW); Shih-Chou Kuo, New Taipei (TW)

(73) Assignee: Princeton Technology Corporation, New Taipei (TW)

( * ) Notice: Subject to any disclaimer, the term of this patent is extended or adjusted under 35 U.S.C. 154(b) by 0 days.

(21) Appl. No.: 13/920,535

(22) Filed: Jun. 18, 2013

(65) Prior Publication Data
US 2014/0159784 A1   Jun. 12, 2014

(30) Foreign Application Priority Data

Dec. 11, 2012 (TW) .............................. 101146523 A

(51) Int. Cl.
*H03L 7/00* (2006.01)
*H03K 17/22* (2006.01)

(52) U.S. Cl.
CPC ............... *H03K 17/223* (2013.01); *H03L 7/00* (2013.01)
USPC .......................................... 327/143; 327/198

(58) Field of Classification Search
CPC ............................................................ H03L 7/00
USPC .......................................... 327/142, 143, 198
See application file for complete search history.

(56) References Cited

U.S. PATENT DOCUMENTS

| | | | |
|---|---|---|---|
| 2006/0091920 A1* | 5/2006 | Youssef | 327/143 |
| 2007/0024333 A1* | 2/2007 | Suzuki | 327/143 |
| 2007/0096786 A1* | 5/2007 | Hsieh | 327/198 |
| 2009/0243669 A1* | 10/2009 | Tsai et al. | 327/143 |
| 2012/0092045 A1* | 4/2012 | Chao et al. | 327/142 |
| 2012/0169385 A1* | 7/2012 | Ren | 327/142 |
| 2013/0147524 A1* | 6/2013 | Hachida et al. | 327/108 |
| 2014/0035634 A1* | 2/2014 | Shrivastava et al. | 327/143 |

\* cited by examiner

*Primary Examiner* — Ryan Jager
(74) *Attorney, Agent, or Firm* — Muncy, Geissler, Olds & Lowe, P.C.

(57) ABSTRACT

A power-on reset circuit has a first impedance device, a first switch device, a first capacitor, a second switch device, a third switch device, a fourth switch device, a second impedance device, a second capacitor, and a control circuit coupled to a reset input terminal of a circuit device. When the power-on reset circuit is supplied with electric power, the first switch device and the third switch device are turned on and the second switch device and the fourth switch device are turned off. When the electric power is removed from the power-on reset circuit, the first switch device and the third switch device are turned off and the second switch device and the fourth switch device are turned on. The second capacitor is discharged through the fourth switch to a voltage level being close to a ground voltage.

3 Claims, 5 Drawing Sheets

POWER-ON RESET CIRCUIT

CROSS REFERENCE TO RELATED APPLICATIONS

This application claims priority of Taiwan Patent Application No. 101146523, filed on Dec. 11, 2012, the entirety of which is incorporated by reference herein.

BACKGROUND OF THE INVENTION

1. Field of the Invention

The present invention relates to a power-on reset circuit, and in particular to a power-on reset circuit for outputting a predetermined reset signal.

2. Description of the Related Art

When a power source is initially activated, a voltage generated from the power source can not immediately reach a predetermined voltage value. If the voltage which does not reach the predetermined voltage value is applied to a digital circuit, it may cause the initial situation of the digital circuit to be unknown. Generally, the power-on reset circuit is integrated in Very Large Scale Integration (VLSI) circuits for generating a reset signal. Therefore, when the power source is initially activated, the internal circuit of VLSI circuit can obtain a known initial situation according to the reset signal.

FIG. 1 is a diagram illustrating the power-on reset circuit applied to a circuit device. In FIG. 1, when a circuit device 150 is supplied with electric power, the voltage of a Power node $V_{DD}$ coupled to a power-on reset circuit 100 increases from a ground voltage to a predetermined voltage value, such that the power node $V_{DD}$ charges a capacitor $C_P$ through a resistor $P_1$ composed of a PMOS transistor. A control circuit 130 generates a reset signal to the circuit device 150 according to the voltage of the capacitor $C_P$. When the electric power is removed from the power node $V_{DD}$, the capacitor $C_P$ discharges its power to the power node $V_{DD}$ (at this time, the voltage of the power node $V_{DD}$ is close to the ground voltage) through the resistor $P_1$. However, because the resistor $P_1$ is composed of PMOS transistor, the voltage of the capacitor $C_P$ can only be dropped to a threshold voltage of the P-N junction in a short time. That is to say, the capacitor $C_P$ can not be discharged completely. The voltage of the capacitor $C_P$ can not be dropped to a voltage value equal to the reference ground GND. Therefore, when the circuit device 150 (power-on reset circuit 100) is supplied with electric power the next time, the voltage that is preexisted in the capacitor $C_P$ drives the control circuit 130 to generate an incorrect control signal, which would further incapacitate the power-on reset circuit 100.

Therefore, a new power-on reset circuit is needed. During the discharging operation, the voltage of the capacitor of the power-on reset circuit is able to be dropped to a voltage value equal to the ground voltage. Thus, the next time the power-on reset circuit is supplied with electric power, the control circuit of the power-on reset circuit can generate the correct control signal, or enable the power-on reset circuit to work normally.

BRIEF SUMMARY OF THE INVENTION

The present invention presents a power-on reset circuit, comprising a first impedance device and a first switch device, each of which is connected to each other and coupled between a power node and a first node. A control terminal of the first switch device is coupled to the power node. The power-on reset circuit further comprises a first capacitor coupled between the first node and a reference ground, and a second switch device coupled between the first node and a connection node. A control terminal of the second switch device is coupled to the power node. The power-on reset circuit further comprises a third switch device coupled between the connection node and the reference ground. A control terminal of the third switch device is coupled to the power node. The power-on reset circuit further comprises a fourth switch device coupled between a second node and the reference ground. A control terminal of the fourth switch device is coupled to the connection node. The power-on reset circuit further comprises a second impedance device coupled between the power node and the second node, and a second capacitor coupled between the second node and the reference ground. The power-on reset circuit further comprises a control circuit coupled between the second node and a reset input terminal of a circuit device. When the power node is supplied with electric power, the first switch device and the third switch device are turned on and the second switch device and the fourth switch device are turned off. Under this condition, the electric power supplied to the power node charges the second capacitor through the second impedance device. When the voltage of the second capacitor is elevated to a predetermined voltage value, the control circuit outputs a reset signal according to the predetermined voltage value. When the electric power is removed from the power node, the first switch device and the third switch device are turned off and the second switch device and the fourth switch device are turned on. Under this condition, the second capacitor is discharged to a voltage level being close to the reference ground through the fourth switch.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
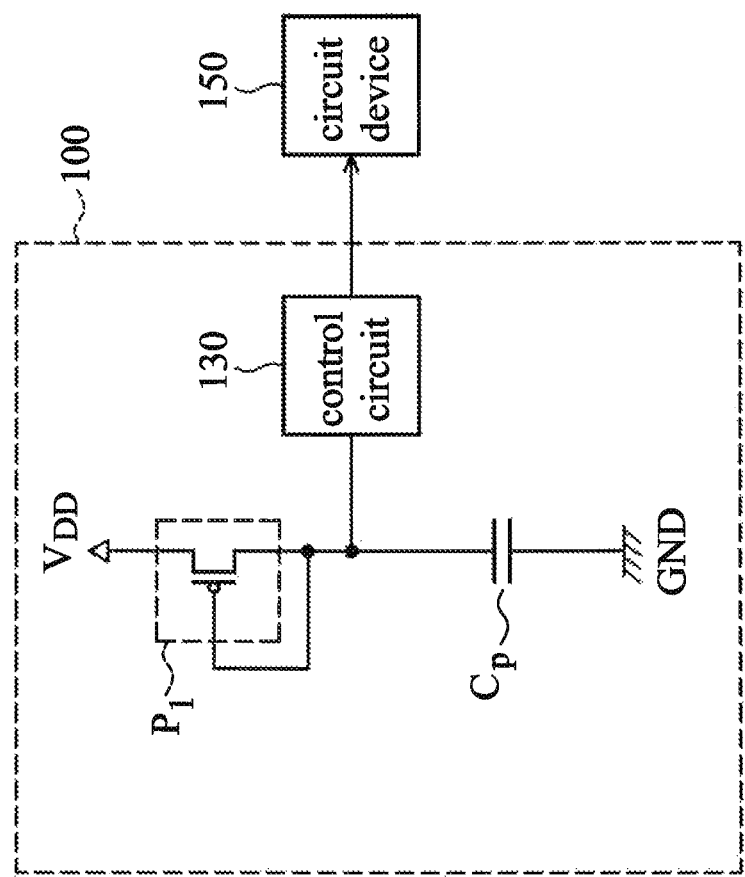
FIG. 1 is a diagram illustrating the power-on reset circuit applied to a circuit device.
Figure 2A:
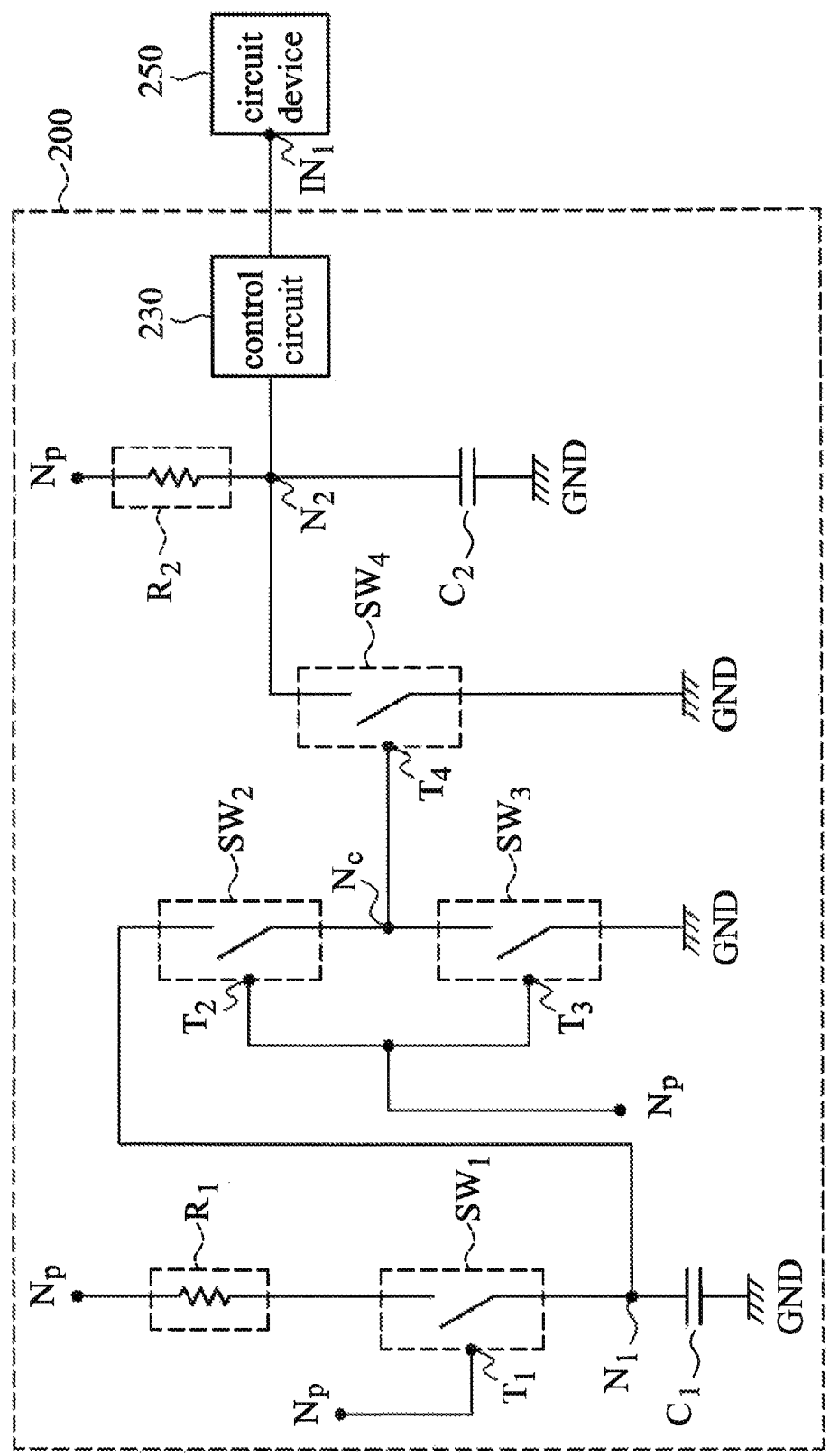
FIG. 2A is a diagram illustrating the power-on reset circuit applied to a circuit device according to an embodiment of the invention.

FIG. 2A is a diagram illustrating the power-on reset circuit applied to a circuit device according to an embodiment of the invention. A power-on reset circuit 200 comprises: a first impedance device $R_1$, a second impedance device $R_2$, a first switch device $SW_1$, a second switch device $SW_2$, a third switch device $SW_3$, a first switch device $SW_4$, a first capacitor $C_1$, a second capacitor $C_2$, and a control circuit 230.

The first impedance device $R_1$ and the first switch device $SW_1$ are connected in series with each other and coupled between a power node $N_P$ and a first node $N_1$, and a control terminal $T_1$ of the first switch device $SW_1$ is coupled to the power node $N_P$. The first capacitor $C_1$ is coupled between the first node $N_1$ and a reference ground GND. The second switch device $SW_2$ is coupled between the first node $N_1$ and a connection node $N_C$ and a control terminal $T_2$ of the second switch device $SW_2$ is coupled to the power node $N_P$. The third switch device $SW_3$ is coupled between the connection node $N_C$ and the reference ground GND and a control terminal $T_3$ of the third switch device $SW_3$ is coupled to the power node $N_P$. The fourth switch device $SW_4$ is coupled between a second node $N_2$ and the reference ground GND and a control terminal $T_4$ of the fourth switch device $SW_4$ is coupled to the connection node $N_C$. The second impedance device $R_2$ is coupled between the power node $N_P$ and the second node $N_2$. The second capacitor $C_2$ is coupled between the second node $N_2$ and the reference ground GND. The control circuit 230 is coupled between the second node $N_2$ and a reset input terminal $IN_1$ of a circuit device 250.

Figure 2B:
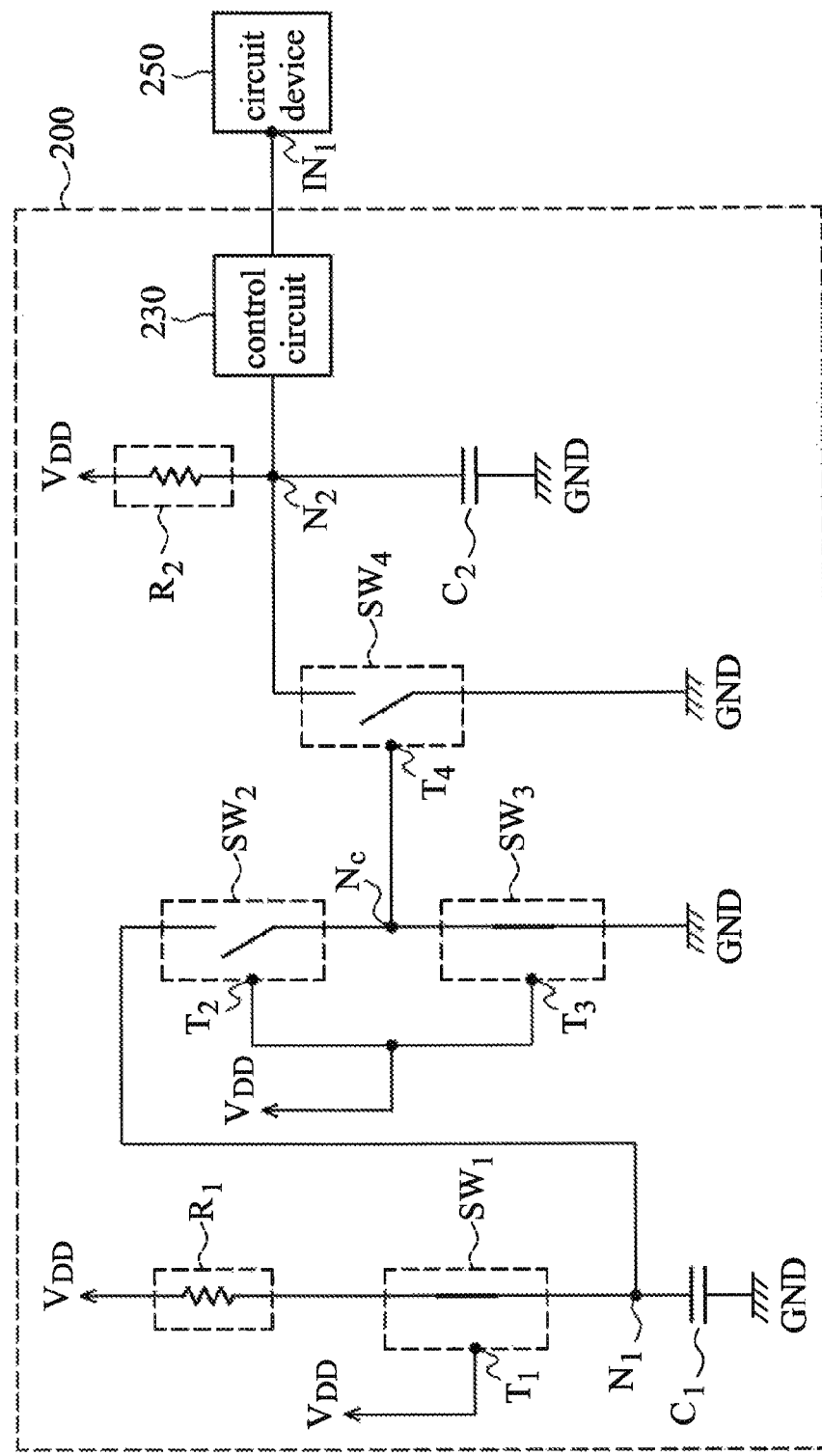
FIG. 2B is a diagram illustrating the power node supplied with electric power in FIG. 2A.

FIG. 2B is a diagram illustrating that the power node is supplied with electric power in FIG. 2A. When the power node $N_P$ is supplied with the electric power (a voltage $V_{DD}$ is applied to the power node $N_P$), the first switch device $SW_1$ is turned on. The electric power (voltage $V_{DD}$) of the power node $N_P$ charges the first capacitor $C_1$ through the first impedance device $R_1$. At the same time, the electric power of the power node $N_P$ manipulates the second switch device $SW_2$ to turn off and the third switch device $SW_3$ to turn on. Because the third switch device $SW_3$ is turned on, the voltage of the connection node $N_C$ is close to the reference ground GND. Thus, the fourth switch device $SW_4$ is turned off. The electric power of the power node $N_P$ charges the second capacitor $C_2$ through the second impedance device $R_2$. When the electric power of the power node $N_P$ charges the second capacitor $C_2$ to a predetermined voltage value, the control circuit 230 outputs a reset signal to the reset input terminal $IN_1$ of the circuit device 250 according to the predetermined voltage value.

Figure 2C:
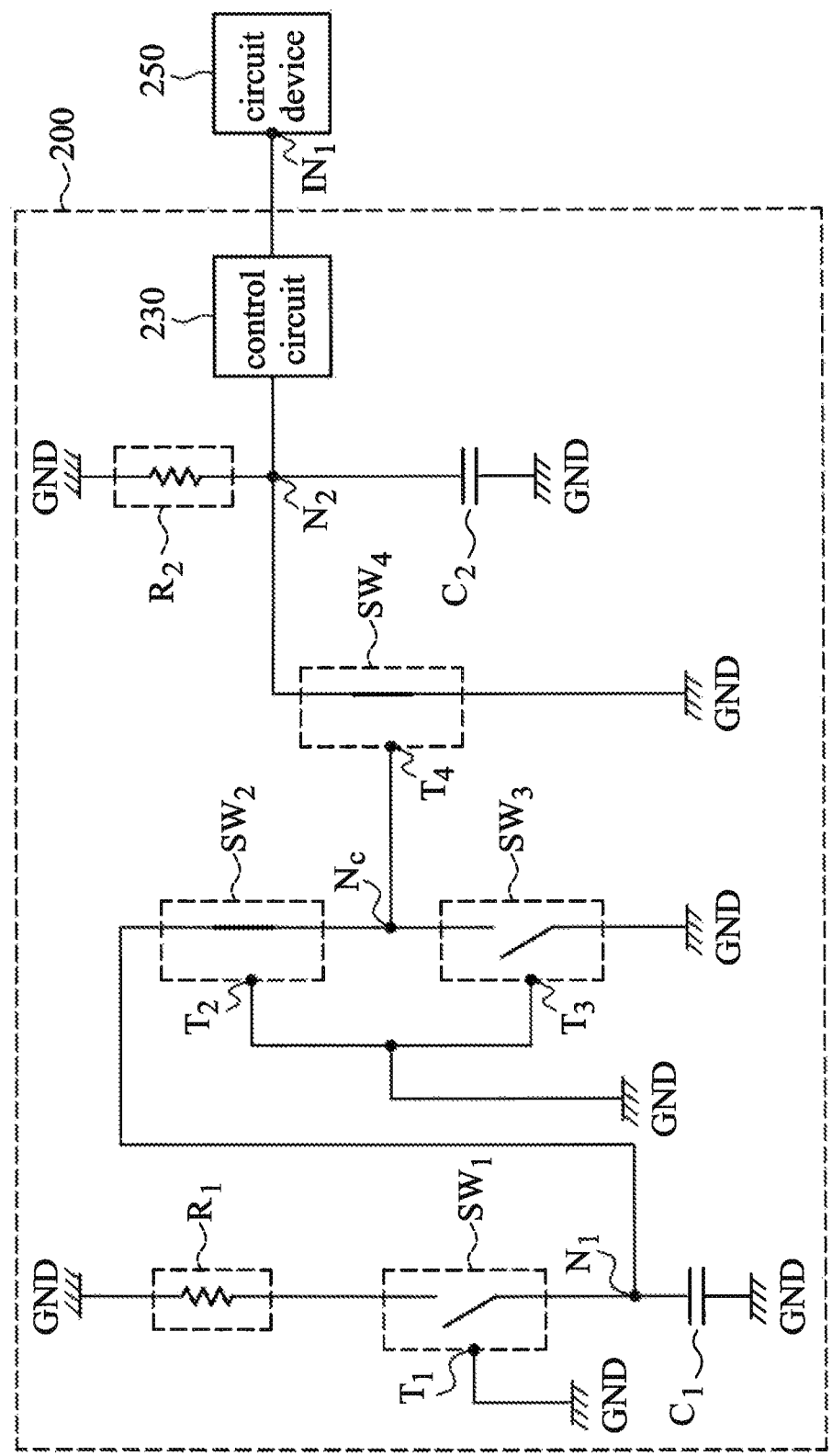
FIG. 2C is a diagram illustrating that the electric power is removed from the power node in FIG. 2B.

FIG. 2C is a diagram illustrating that the electric power is removed from the power node in FIG. 2B. When the electric power is removed from the power node $N_P$ (for example, the power node $N_P$ is coupled to the reference ground GND), the first switch device $SW_1$ and the third switch device $SW_3$ are turned off and the second switch device $SW_2$ is turned on. The voltage of the first capacitor $C_1$ is transmitted to the control terminal $T_4$ of the fourth switch device $SW_4$ through the second switch device $SW_2$, so as to turn on the fourth switch device $SW_4$. The second capacitor $C_2$ is discharged to a voltage level being close to the reference ground GND through the fourth switch device $SW_4$.

When the electric power is removed from the power node $N_P$, the voltage required to operate the power-on reset circuit 200 is supplied from the first capacitor $C_1$. Therefore, no additional electric power is available to generate the current flowing into the power-on reset circuit 200, and thus the value of the quiescent current is zero.

Figure 3:
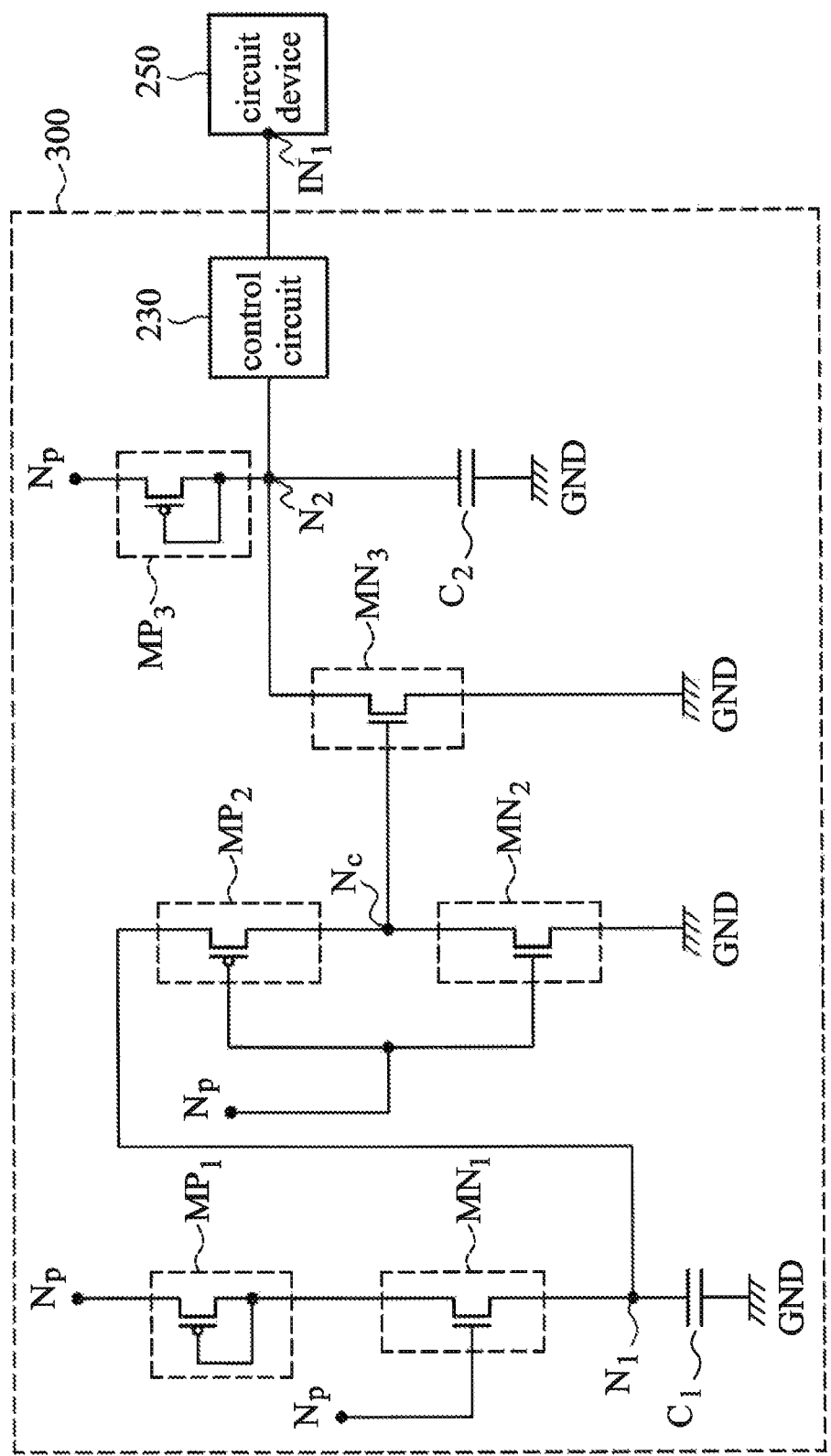
FIG. 3 is a diagram illustrating a power-on reset circuit applied to a circuit device according to an embodiment of the invention.

FIG. 3 is a diagram illustrating a power-on reset circuit 300 applied to a circuit device according to an embodiment of the invention. The circuit structure in FIG. 3 is the same as FIG. 2, and the difference is that FIG. 3 further discloses the implementation of the circuit in detail. As shown in FIG. 3, the first switch device $SW_1$, the third switch device $SW_3$ and the fourth switch device $SW_4$ shown in FIG. 2 are respectively composed of a NMOS transistor $MN_1$, $MN_2$, and $MN_4$, and the second switch device $SW_2$ is composed of a PMOS transistor $MP_2$. Next, as shown in FIG. 3, the first impedance device $R_1$ and the second impedance device $R_2$ shown in FIG. 2 are respectively composed of a PMOS transistor $MP_1$ and $MP_3$, wherein the gate electrode and the drain electrode of the PMOS transistor $MP_1$ and $MP_3$ are connected to each other. It is noteworthy that the first impedance device $R_1$ and the second impedance device $R_2$ are respectively composed of a PMOS transistor $MP_1$ and $MP_3$ in this embodiment. However, this circuit topology is used only for illustration, but it is not limited thereto. Because the second switch device $SW_2$ and the third switch device $SW_3$ are composed of a PMOS transistor $MP_2$ and a NMOS transistor $MN_2$, respectively, the second switch device $SW_2$, is turned off and the third switch device $SW_3$ is turned on as the power node $N_P$ is supplied with electric power. On the contrary, when the power node $N_P$ is not supplied with electric power, the second switch device $SW_2$ is turned on and the third switch device $SW_3$ is turned off. The circuit operation in FIG. 3 is described in the preceding paragraphs involved with the circuitry of FIG. 2A~2C, so there is no need to go further on this issue.

Because the second capacitor $C_2$ is discharged to the voltage level equal to the reference ground GND, the next time that the power node $N_P$ of the power-on reset circuit 300 is supplied with electric power, the power-on reset circuit 300 can operate normally and output a reset signal.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power-on reset circuit, comprising:
   a first impedance device and a first switch device, each of which is connected in series with each other and coupled between a power node and a first node, wherein a control terminal of the first switch device is coupled to the power node;
   a first capacitor, coupled between the first node and a reference ground;
   a second switch device, coupled between the first node and a connection node, wherein a control terminal of the second switch device is coupled to the power node;
   a third switch device, coupled between the connection node and the reference ground, wherein a control terminal of the third switch device is coupled to the power node;
   a fourth switch device, coupled between a second node and the reference ground, wherein a control terminal of the fourth switch device is coupled to the connection node;
   a second impedance device, coupled between the power node and the second node;
   a second capacitor, coupled between the second node and the reference ground; and
   a control circuit, coupled between the second node and a reset input terminal of a circuit device;
   wherein when the power node is supplied with electric power, the first switch device and the third switch device are turned on and the second switch device and the fourth switch device are turned off to allow the second capacitor to be charged with the electric power of the power node through the second impedance device, and the electric power of the power node charges the second capacitor to a predetermined voltage value, the control circuit outputs a reset signal;

when the electric power is removed from the power node, the first switch device and the third switch device are turned off and the second switch device and the fourth switch device are turned on, and the second capacitor is discharged to a voltage level being close to the reference ground through the fourth switch device.

2. The power-on reset circuit as claimed in claim 1, wherein:
when the power node is supplied with electric power, the electric power charges the first capacitor; and
when the electric power is removed from the power node, the voltage of the first capacitor is supplied to the control terminal of the fourth switch device through the second switch device, so as to turn on the fourth switch device.

3. The power-on reset circuit as claimed in claim 1, wherein the first switch device, the third switch device, and the fourth switch device are NMOS transistors, and the second switch device is a PMOS transistor.

\* \* \* \* \*